United States Patent
Chaware et al.

(10) Patent No.: US 9,385,106 B1
(45) Date of Patent: Jul. 5, 2016

(54) METHOD FOR PROVIDING CHARGE PROTECTION TO ONE OR MORE DIES DURING FORMATION OF A STACKED SILICON DEVICE

(71) Applicant: Xilinx, Inc., San Jose, CA (US)

(72) Inventors: Raghunandan Chaware, Sunnyvale, CA (US); Inderjit Singh, Saratoga, CA (US); Glenn O'Rourke, Gilroy, CA (US); Ganesh Hariharan, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/444,661

(22) Filed: Jul. 28, 2014

(51) Int. Cl.
*H01L 21/00* (2006.01)
*H01L 23/00* (2006.01)
*H01L 21/56* (2006.01)
*H01L 21/304* (2006.01)
*H01L 23/60* (2006.01)

(52) U.S. Cl.
CPC .............. *H01L 24/97* (2013.01); *H01L 21/304* (2013.01); *H01L 21/563* (2013.01); *H01L 23/60* (2013.01)

(58) Field of Classification Search
CPC ....... H01L 21/48; H01L 21/563; H01L 23/16; H01L 23/28; H01L 24/97; H01L 23/60; H01L 21/304
USPC .......... 257/704, 723, 787, 788, 737; 438/106, 438/112, 124, 127
See application file for complete search history.

(56) References Cited

U.S. PATENT DOCUMENTS

| | | | | |
|---|---|---|---|---|
| 2011/0193205 A1* | 8/2011 | Hsieh | ................ | H01L 23/3128 257/666 |
| 2015/0028471 A1* | 1/2015 | Lin | ................ | H01L 23/49811 257/737 |
| 2015/0048500 A1* | 2/2015 | Yu | .................. | H01L 24/19 257/737 |
| 2015/0048503 A1* | 2/2015 | Chiu | ................ | H01L 23/147 257/738 |
| 2015/0091145 A1* | 4/2015 | Lin | .................. | H01L 21/568 257/668 |

OTHER PUBLICATIONS

Specification and drawings for U.S. Appl. No. 14/172,657, filed Feb. 4, 2014, Kwon et al.

* cited by examiner

*Primary Examiner* — Jarrett Stark
*Assistant Examiner* — Shahed Ahmed
(74) *Attorney, Agent, or Firm* — Gerald Chan (57) ABSTRACT

A method for providing charge protection to a die during formation of an integrated circuit, includes bonding the die to an interposer to form an unprotected stacked silicon component; encapsulating the unprotected stacked silicon component with a mold compound to cover at least a top surface of the die; grinding the mold compound to reduce a thickness of the mold compound; bonding a carrier wafer to the mold compound; removing the carrier wafer from the mold compound; and removing the mold compound from the top surface of the die after the carrier wafer is removed from the mold compound, to expose the top surface of the die.

21 Claims, 9 Drawing Sheets

METHOD FOR PROVIDING CHARGE PROTECTION TO ONE OR MORE DIES DURING FORMATION OF A STACKED SILICON DEVICE

TECHNICAL FIELD

The present disclosure relates generally to providing charge protection to one or more dies during formation of a stacked silicon device.

BACKGROUND

Stacked silicon devices may include multiple dies connected through an interposer, which is then mounted on a package substrate. This allows for increased functionality of a stacked silicon device, as several different dies performing different functions may be packaged together in a single stacked silicon device.

Conventionally, during formation of the stacked silicon device, the multiple dies are exposed during several of the process steps. It is hypothesized that during some of the process steps, including mold encapsulation/grinding and bonding/removing of a carrier wafer, the dies may be exposed to charge. Such exposure to charge leads to potential damage of the dies and consequently undesired behavior of the dies. One particular type of undesired behavior exhibited by dies that are exposed to charge during formation of the stacked silicon device is a poor readback yield. If the dies have memory cells, the memory cells of the dies may become damaged during formation of the stacked silicon device such that incorrect/incomplete data is subsequently read back from memory cells.

Because such charge exposure of dies during formation of stacked silicon devices may potentially lead to undesired behavior, it may be desirable to protect the dies from potential exposure to charge during packing of the stacked silicon device.

SUMMARY

A method for providing charge protection to a die during formation of an integrated circuit, includes: bonding the die to an interposer to form an unprotected stacked silicon component; encapsulating the unprotected stacked silicon component with a mold compound to cover at least a top surface of the die; grinding the mold compound to reduce a thickness of the mold compound; bonding a carrier wafer to the mold compound; removing the carrier wafer from the mold compound; and removing the mold compound from the top surface of the die after the carrier wafer is removed from the mold compound, to expose the top surface of the die.

A method for providing charge protection to a die during formation of an integrated circuit, includes: bonding the die to an interposer to form an unprotected stacked silicon component; encapsulating the unprotected stacked silicon component with a mold compound to cover at least a top surface of the die; grinding the mold compound to expose the top surface of the die; forming a protective component over the top surface of the die after the mold compound is grinded to form a protected stacked silicon component; bonding a carrier wafer to the protected stacked silicon component; removing the carrier wafer from the protected stacked silicon component; and removing the protective component from the top surface of the die after the carrier wafer is removed from the protected stacked silicon component, to expose the top surface of the die.

Other and further aspects and features will be evident from reading the following detailed description.

BRIEF DESCRIPTION OF THE DRAWINGS

The drawings illustrate the design and utility of various features described herein, in which similar elements are referred to by common reference numerals. These drawings are not necessarily drawn to scale. In order to better appreciate how the above-recited and other advantages and objects are obtained, a more particular description will be rendered, which are illustrated in the accompanying drawings. These drawings depict only exemplary features and are not therefore to be considered limiting in the scope of the claims.

FIGS. 1-1 to 1-6 are cross-sectional schematic diagrams illustrating a method of forming a stacked silicon device.

FIGS. 3-1 to 3-7 are cross-sectional schematic diagrams illustrating a method for providing charge protection to a plurality of dies during formation of a stacked silicon device.

FIGS. 5-1 to 5-8 are cross-sectional schematic diagrams illustrating a method for providing charge protection to a plurality of dies during formation of a stacked silicon device.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

One or more examples described herein provide a method for providing charge protection to one or more dies (e.g., FPGA dies, or any of other types of semiconductor dies, etc.) during formation of a stacked silicon device. In some cases, the stacked silicon device may be a stacked silicon interconnect technology (SSIT) device, but it may be other types of stacked silicon device in other cases. In some cases, protective components are formed over a top surface of a plurality of dies before or after the plurality of dies have been bonded to an interposer. The protective components remain over the top surface of the dies during subsequent assembly/processing steps in order to protect the dies from charge exposure during those subsequent assembly/processing steps.

In some other cases, a layer of mold compound is formed over a surface of a plurality of dies during formation of a stacked silicon device. Grinding of the mold compound is subsequently performed, but a thin layer of the mold compound remains over the top surface of the dies during the grinding steps as well as subsequent assembly/processing steps in order to protect the dies from charge exposure during the grinding step and those subsequent assembly/processing steps. The thin layer of mold compound is then removed from the top surfaces of the dies after the subsequent assembly/processing steps to allow for subsequent operation of the stacked silicon device to occur without problems.

Also, in some cases, an electrically non-conductive layer may be formed on a wafer containing plurality of dies before dicing. In such cases, the mold compound may be applied over the electrically non-conductive layer, and may be later completely removed as long as the non-conductive layer remains on the dies.

It should be noted that as used in this specification, the term "step" refers to an action or process item in a method, and should not be interpreted as a step-plus-function.

FIGS. 1-1 to 1-6 are cross-sectional schematic diagrams illustrating a method of forming a stacked silicon device, and the potential charge exposure incurred by dies during formation of the stacked silicon device. The stacked silicon device may be, for example, a SSIT device.

Figure 11:
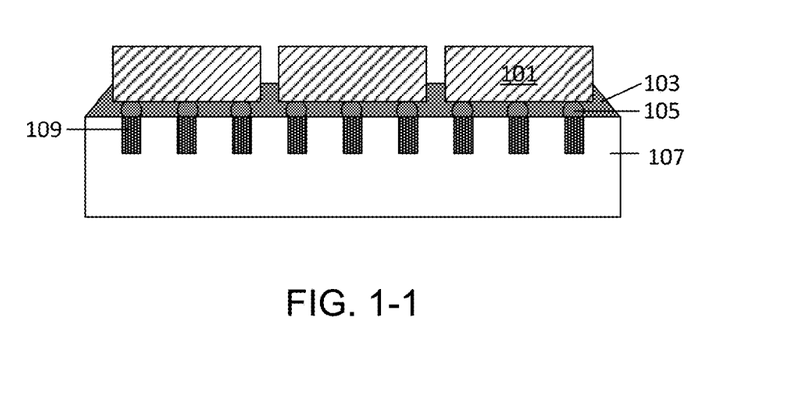

Initially, a plurality of dies 101 are bonded to an interposer 107. The dies 101 may be any types of semiconductor dies, such as FPGA dies, or any of other types of dies. The dies 101 may be bonded to the interposer 107 using solder bumps 105, that may also be referred to herein as microbumps. The microbumps 105 may be composed of various electrically conductive materials such as copper or nickel. An underfill process may be performed to deposit underfill material 103 between the dies 101 and the interposer 107. This provides for greater mechanical stability between the dies 101 and the interposer 107.

The interposer may include through-silicon-vias (TSVs) 109 to allow for the dies 101 to communicate between each other as well as to allow for the dies 101 to communicate with components external to the dies 101, such as a printed circuit board or other package substrate. When the plurality of dies 101 are initially bonded to the interposer 107, the interposer may be configured such that the TSVs 109 are only exposed at the surface adjacent to the dies 101. The TSVs 109 may be exposed at the opposite surface during subsequent processing steps, which will be described in greater detail below.

When the dies 101 are bonded to the interposer 107, a top surface of the dies 101 are exposed as illustrated in FIG. 1-1. The bottom surface of the dies 101 may be shielded by the underfill material 103, microbumps 105 and the dies 101 themselves. However, having the top surface of the dies 101 exposed during subsequent stacked silicon device formation process may lead to the dies 101 being damaged by charge during that process.

Figure 12:
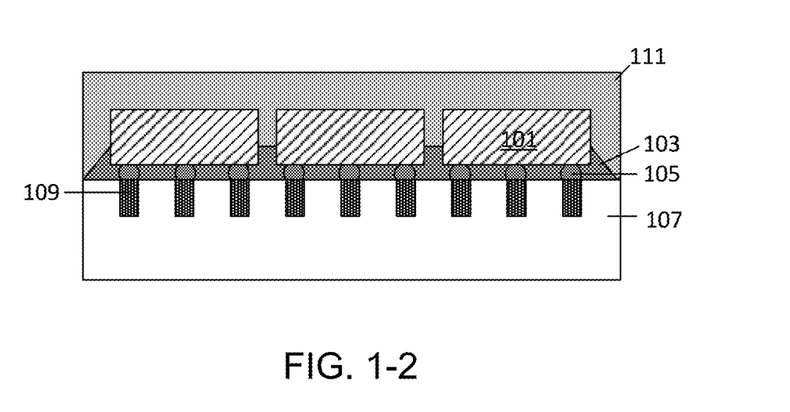

A mold encapsulation may then be performed to encapsulate the dies 101 and interposer 107. This is illustrated in FIG. 1-2, where a mold compound 111 is formed over the dies 101 and interposer 107. The mold compound 111 may be composed of silica-filled epoxy material and the mold compound 111 may be formed using techniques such as compression molding or vacuum lamination molding. Such mold encapsulation techniques may be performed at the wafer level.

Figure 13:
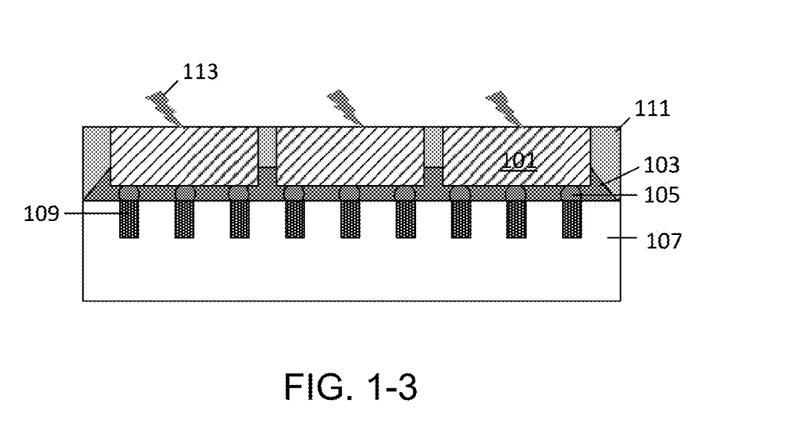

Although the mold compound 111 initially covers the top surface of the dies 101, a subsequent grinding step and polishing step are performed on the mold compound 111 to again expose the top surface of the dies 101. This is illustrated in FIG. 1-3, where the mold compound 111 is grinded to a level at or below the top surface of the dies 101, such that the dies 101 are exposed. A polishing step is then performed to the mold compound 111 to complete the process of mold encapsulation. During both the grinding step and the polishing step, the dies 101 may be subjected to charge 113 associated with those processing steps. Because the dies 101 have a top surface that is exposed during those processing steps, the charge 113 associated with those processing steps may damage the dies 101.

Figure 14:
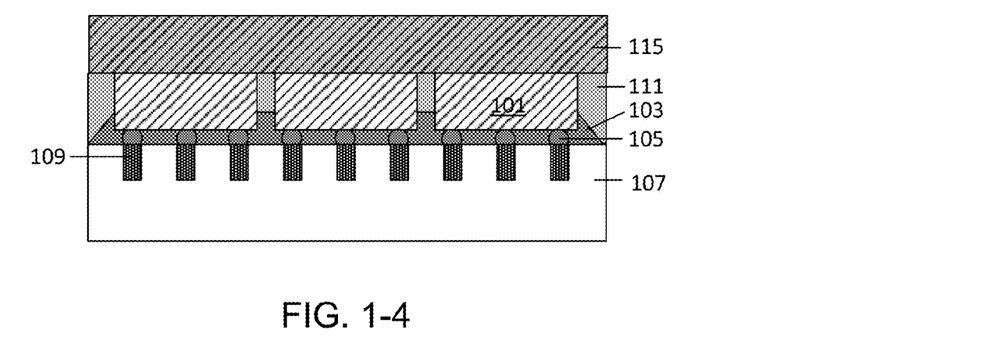

After the process of mold encapsulation has been completed, a carrier wafer 115 may be bonded to the top surface of the dies 101 and the mold compound 111 as illustrated in FIG. 1-4. The carrier wafer is used to handle the dies 101 and interposer 107 during subsequent process steps. The carrier wafer 115 may be implemented as a glass wafer or a silicon wafer and techniques for bonding the carrier wafer 115 to the top surface of the dies 101 may involve thermal bonding using a thermally cured material which may be subsequently removed.

Figure 15:
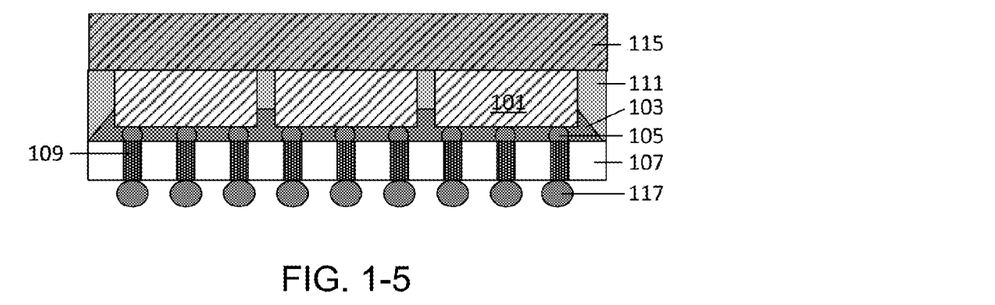

The carrier wafer may be utilized to handle the dies 101 and interposer 107 during a backside grinding step and a bumping step. The result of the backside grinding step and bumping step is illustrated in FIG. 1-5. The backside grinding step involves grinding the backside of the interposer 107 such that the TSVs 109 may be exposed at the backside of the interposer 107. A bumping step is then performed to form C4 bumps 117 on the backside of the interposer 107. The C4 bumps allow for communication between the dies and any external component (e.g., printed circuit board, package substrate) connected to the C4 bumps 117. In some cases, charge associated with backside grinding, the bumping step, and/or other processes (such as, chemical-mechanical planarization (CMP), etc.), may damage the die if the backside of the die is exposed.

Figure 16:
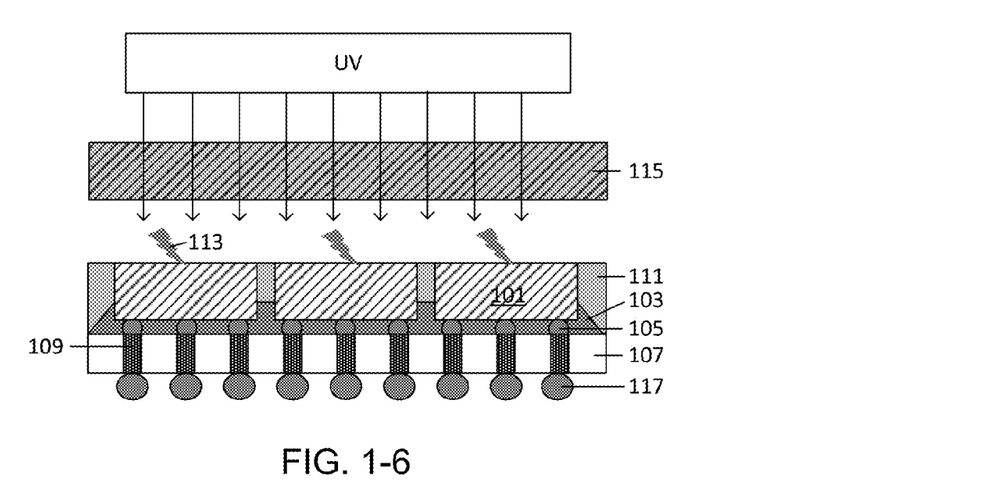

Once the backside grinding and bumping steps are completed, the carrier wafer 115 is removed as illustrated in FIG. 1-6. Various processes may be utilized to remove the carrier wafer. One example process for removing the carrier wafer 115 involves irradiating the carrier wafer 115 with UV radiation to release the carrier wafer 115 from the top surface of the dies 101. During the removal process, and any subsequent cleaning processes, the top surface of the dies 101 may again be exposed to charge 113 that may damage the dies 101.

Thus, because the top surface of the dies 101 are exposed to charge associated with certain processing steps (e.g., mold compound grinding and carrier removal), the dies may become damaged during those processing steps, leading to undesirable behavior.

While FIGS. 1-1 to 1-6 illustrate some steps used in the formation of a stacked silicon device, one ordinarily skilled in the art will recognize that additional and/or alternative steps may also be used in forming a stacked silicon device. Such additional/alternative steps may also lead to the top surface of the dies being subjected to charge that may damage its performance, particularly where the top surfaces of the dies are exposed. In some cases, the dies may also be subjected to charge even if their top surfaces are not exposed (e.g., during removal of the mold compound 111 and before the mold compound 111 is completely removed, and/or during removal of the carrier wafer 115 and before the carrier wafer 115 is completely removed).

In order to protect the dies from charge during formation of the stacked silicon device, various mechanisms may be used to insulate the top surface of the die during stacked silicon device formation.

Figure 2:
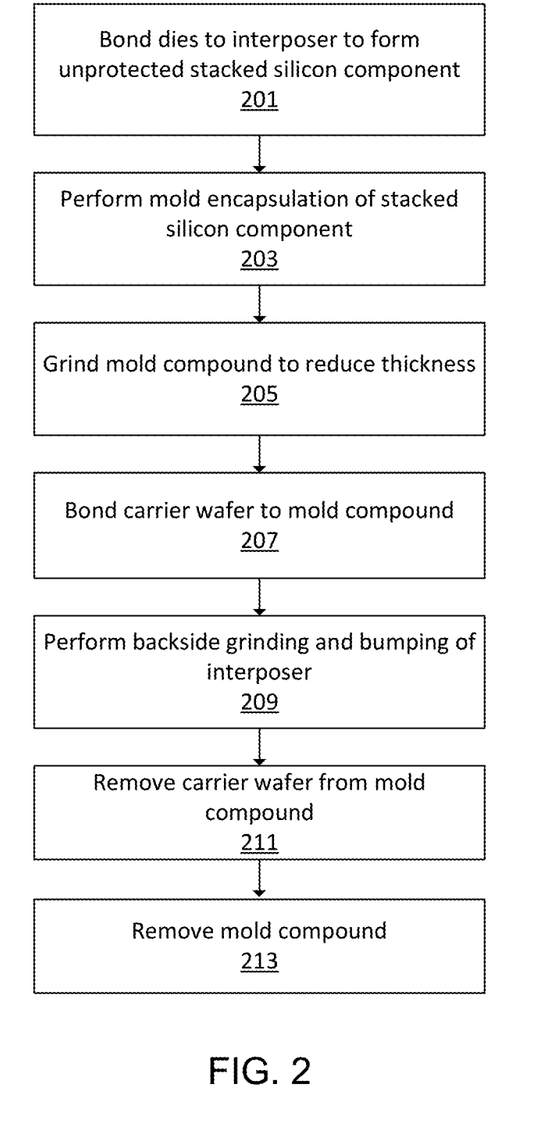
FIG. 2 is a flow diagram illustrating a method for providing charge protection to a plurality of dies during formation of a stacked silicon device.

FIG. 2 is a flow diagram illustrating a method for providing charge protection to a plurality of dies during formation of a stacked silicon device. The dies may be FPGA dies in some cases. In other cases, the dies may be other types of dies. Also, the stacked silicon device may be a SSIT device in some cases. However, in other cases, the stacked silicon device may be other types of stacked silicon device. Also, in other cases, instead of having multiple dies, there may be only one die.

Initially, dies are bonded to an interposer to form an unprotected stacked silicon component as shown at item 201. The term "unprotected stacked silicon component" will be used herein to refer to the structure resulting from bonding the dies to the interposer where the dies are not charge protected prior to being bonded to the interposer.

In some cases, the dies may be bonded to the interposer using solder bumps or microbumps. The solder bumps and microbumps may be composed of any electrically conductive material such as copper or nickel. It is the bottom surface of the dies that are bonded to the interposer via the microbumps.

The act of bonding the dies to the interposer may also include an underfill process to deposit underfill material between the dies and the interposer to provide for greater mechanical stability.

After the dies have been bonded to the interposer to form the unprotected stacked silicon component, mold encapsulation of the unprotected stacked silicon component is performed as shown at item 203. Mold encapsulation of the unprotected stacked silicon component involves depositing a mold compound over the unprotected stacked silicon, such that the mold compound covers the top surface of the dies. As mentioned above, the mold compound may be composed of silica-filled epoxy material and the mold compound may be formed using techniques such as compression molding or vacuum lamination molding.

The mold compound may be composed of a thermally conductive material, or alternatively may be composed of a non-thermally conductive material.

The mold compound is then grinded to reduce its thickness, while still covering the top surface of the dies as shown at item 205. Grinding of the mold compound may be accomplished using a coarse grinding or fine grinding technique.

The thin layer of mold compound remains on the top surfaces of the dies during all of the subsequent stacked silicon device formation steps, and protects the dies from charge exposure during subsequent device formation steps. In order to allow for subsequent operation of the stacked silicon device to occur without problems, the thin layer of mold compound is later removed after subsequent stacked silicon device formation steps, which will be described in greater detail below.

During the performance of the grinding and polishing aspects of mold encapsulation, the unprotected stacked silicon component may be exposed to charge. However, because the top surfaces of the dies are shielded from charge exposure by the thin layer of mold compound, the dies are protected from any potential damage that may be caused by exposure to such charge.

A carrier wafer may then be bonded to the thin layer of mold compound as shown at item 207. The carrier wafer may be bonded to the thin layer of mold compound such that the carrier wafer is situated on top of the thin layer of mold compound covering the top surfaces of the dies. The carrier wafer is used to handle the stacked silicon component during subsequent process steps. The carrier wafer may be implemented as a glass wafer or a silicon wafer and techniques for bonding the carrier wafer to the mold compound may involve thermal bonding using a thermally cured material which may be subsequently removed.

The carrier wafer may be utilized to handle the stacked silicon component during a backside grinding step and bumping step as shown at item 209. The backside grinding step involves grinding the backside of the interposer such that the TSVs may be exposed at the backside of the interposer. A bumping step is then performed to form C4 bumps on the backside of the interposer. The C4 bumps allow for communication between the dies and any external component (e.g., printed circuit board, package substrate) connected to the C4 bumps.

Once the backside grinding and bumping steps are completed, the carrier wafer is removed from the mold compound as shown at item 211. Various processes may be utilized to remove the carrier wafer. One example process for removing the carrier wafer involves irradiating the carrier wafer with UV radiation to release the carrier wafer from the stacked silicon component. During the removal process, and any subsequent cleaning processes, the stacked silicon component may again be exposed to charge.

However, because the top surfaces of the dies are shielded from charge exposure by the thin layer of mold compound, the dies are protected from any potential damage that may be caused by exposure to such charge.

Thus, by forming a thin layer of mold compound on top surfaces of dies, those dies may be shielded from charge exposure that may be associated with subsequent stacked silicon device formation steps.

After the subsequent stacked silicon device formation steps have been performed and the carrier wafer has been removed from the thin layer of mold compound, the thin layer of mold compound is removed as shown at item 213.

In some cases, the thin layer of mold compound on the top surfaces of the dies may be removed using a grinding process that may involve using a coarse grinding or fine grinding technique. In other cases, the thin layer of mold compound on the top surfaces of the dies may be removed using an etching process, such as a plasma etch or chemical etch. In other cases, the thin layer of mold compound on the top surfaces of the dies may be removed by performing laser ablation on the mold compound.

The thin layer of mold compound is removed to allow for subsequent operation of the stacked silicon device to occur without problems. This is because leaving the thin layer of mold compound on the top surface of the dies may not provide for adequate heat dissipation during operation of the stacked silicon device, which may lead to undesirable behavior of the stacked silicon device. By removing the thin layer of mold compound from the top surface of the dies, the dies are better able to dissipate heat.

Although the method has been described with reference to protecting multiple dies, in other cases, there may be only one die in the stacked silicon device.

FIGS. 3-1 to 3-7 are cross-sectional schematic diagrams illustrating a method for providing charge protection to a plurality of dies during formation of a stacked silicon device. The method may be the method described with reference to FIG. 2. In some cases, the stacked silicon device may be a SSIT device. In other cases, the stacked silicon device may be other types of stacked silicon device.

Figure 31:
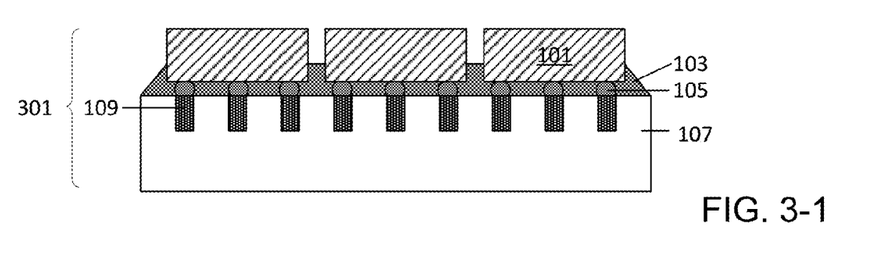

Initially, a plurality of dies 101 are bonded to an interposer 107 as illustrated in FIG. 3-1. The dies 101 are bonded to the interposer 107 to form an unprotected stacked silicon component 301. The term unprotected stacked silicon component 301 is used herein to refer to the structure resulting from bonding the dies 101 to the interposer 107, where the dies 101 are not charge protected prior to being bonded to the interposer 107. The dies 101 may be bonded to the interposer 107 using solder bumps 105, that may also be referred to herein as microbumps. The microbumps 105 may be composed of various electrically conductive materials such as copper or nickel. An underfill process may also be performed to deposit underfill material 103 between the dies 101 and the interposer 107. This provides for greater mechanical stability between the dies 101 and the interposer 107.

The interposer 107 may include through-silicon-vias (TSVs) 109 to allow for the dies 101 to communicate between each other as well as to allow for the dies 101 to communicate with components external to the dies 101, such as a printed circuit board or other package substrate. When the plurality of dies 101 are initially bonded to the interposer 107, the interposer may be configured such that the TSVs 109 are only exposed at the surface adjacent to the dies 101. The TSVs 109 may be exposed at the opposite surface during subsequent processing steps, which will be described in greater detail below.

When the dies 101 are bonded to the interposer 107, a top surface of the dies 101 are exposed as illustrated in FIG. 3-1. The bottom surface of the dies 101 may be shielded by the underfill material 103, microbumps 105 and the dies 101 themselves.

Figure 32:
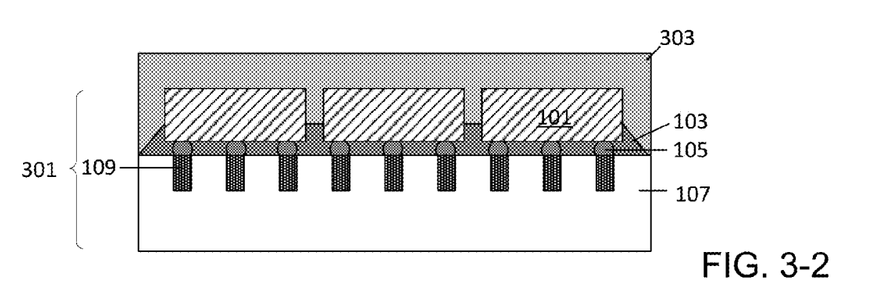

The unprotected stacked silicon component 301 may then be encapsulated with a mold compound. This is illustrated in FIG. 3-2, where a mold compound 303 is formed over the unprotected stacked silicon component 301 such that the mold compound 303 covers the top surface of the dies 101. The mold compound 303 may be composed of thermally conductive filler material such as aluminum oxide ($Al_2O_3$) or carbon nano-tubes and may be formed over the unprotected stacked silicon component 301 using techniques such as compression molding or vacuum lamination molding.

Figure 33:
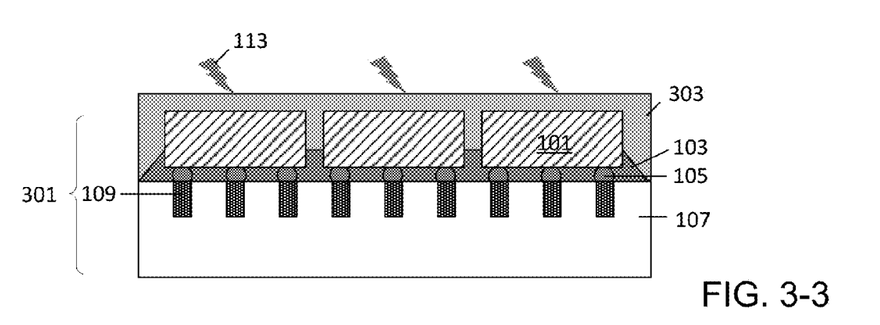

The mold compound 303 is then grinded such that a thin layer of mold compound 303 covers the top surfaces of the dies 101 as shown in FIG. 3-3. In some cases, the thin layer of mold compound 303 covering the dies 101 may have a thickness between 10-30 microns. A thinner layer of mold compound 303 covering the top surfaces of the dies 101 may be preferred in some cases. The mold compound 303 is grinded to a level such the top surface of the dies 101 are protected from charge exposure caused by grinding the mold compound 303. Thus, the thin layer of mold compound 303 protects the top surfaces of the dies 101 from being subjected to charge during any subsequent stacked silicon device formation steps.

The thin layer of mold compound 303 remains on the top surface of a die 101 during all of the subsequent stacked silicon device formation steps. In order to allow for subsequent operation of the stacked silicon device to occur without problems, the thin layer of mold compound is later removed after subsequent stacked silicon device formation steps, which will be described in greater detail below.

A polishing step is then performed on the thin layer of mold compound 303 to remove any contaminants. During the performance of the grinding and polishing aspects, the unprotected stacked silicon component 301 may be exposed to charge 113. However, because the top surfaces of the dies 101 are shielded from charge 113 exposure by the thin layer of mold compound 303, the dies 101 are protected from any potential damage that may be caused by exposure to such charge.

Figure 34:
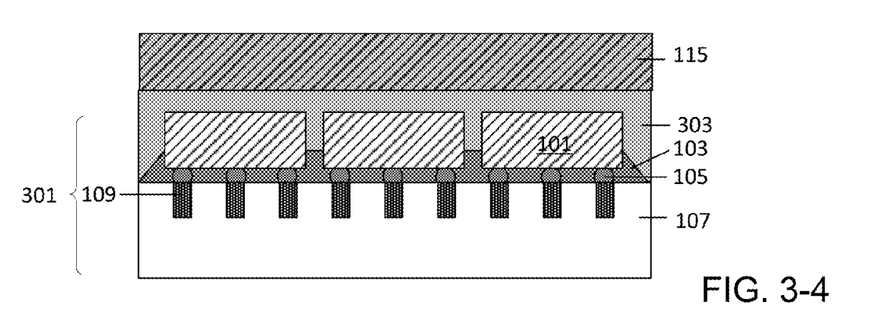

A carrier wafer 115 may then be bonded to the mold compound 303 as illustrated in FIG. 3-4. The carrier wafer 115 is bonded to the exposed surface of the thin layer of mold compound 303 and is used to handle the mold compound 303, dies 101, and interposer 107 during subsequent process steps. The carrier wafer 115 may be implemented as a glass wafer or a silicon wafer and techniques for bonding the carrier wafer 115 to the mold compound 303 may involve thermal bonding using a thermally cured material which may be subsequently removed.

Figure 35:
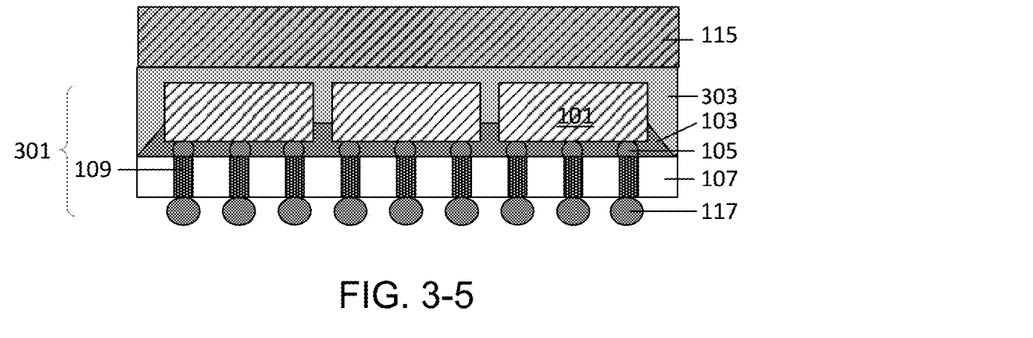

The carrier wafer 115 may be utilized to handle the mold compound 303, dies 101, and interposer 107 during a backside grinding step and bumping step. The resulting structure is illustrated in FIG. 3-5. The backside grinding step involves grinding the backside of the interposer 107 such that the TSVs 109 may be exposed at the backside of the interposer 107. A bumping step is then performed to form C4 bumps 117 on the backside of the interposer 107. The C4 bumps 117 allow for communication between the dies 101 and any external component (e.g., printed circuit board, package substrate) connected to the C4 bumps 117. In some cases, charge associated with backside grinding, the bumping step, and/or other processes (such as, CMP, etc.), may damage the die if the backside of the die is exposed.

Figure 36:
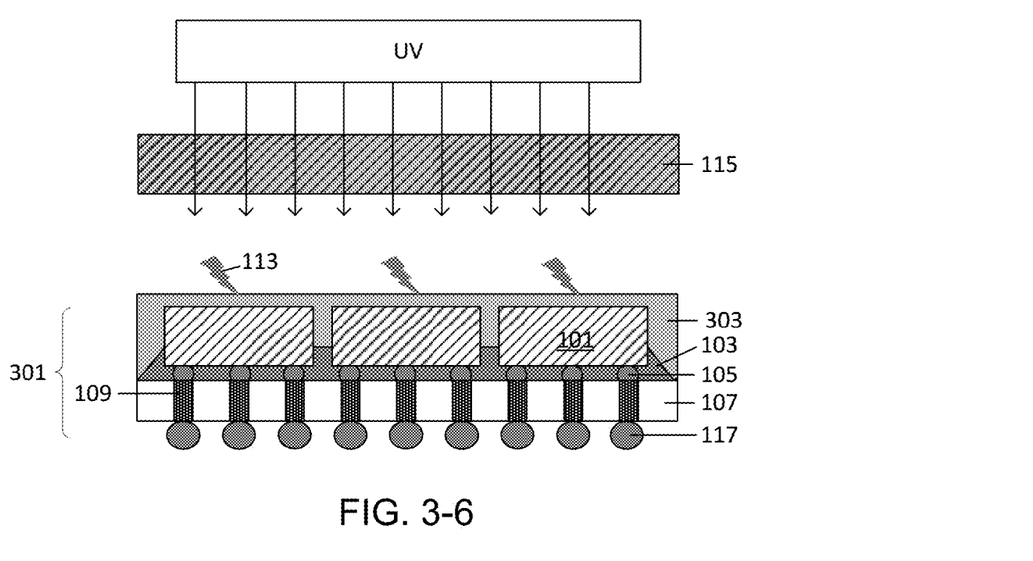

Once the backside grinding and bumping steps are completed, the carrier wafer 115 is removed from the mold compound 303 as illustrated in FIG. 3-6. Various processes may be utilized to remove the carrier wafer 115. One example process for removing the carrier wafer 115 involves irradiating the carrier wafer 115 with UV radiation to release the carrier wafer 115 from the mold compound 303. During various process stages, including but not limited to the grinding of the interposer, the bumping step, the removal of the carrier wafer, subsequent cleaning process(es), etc., the structure formed by the mold compound 303, dies 101, and interposer 107 may be exposed to charge 113.

However, because the top surfaces of the dies 101 are shielded from charge exposure by the thin layer of mold compound 303, the dies 101 are protected from any potential damage that may be caused by exposure to such charge 113.

Thus, by forming a thin layer of mold compound 303 on top surfaces of dies 101, those dies 101 may be shielded from charge exposure that may be associated with subsequent stacked silicon device formation steps.

Figure 37:
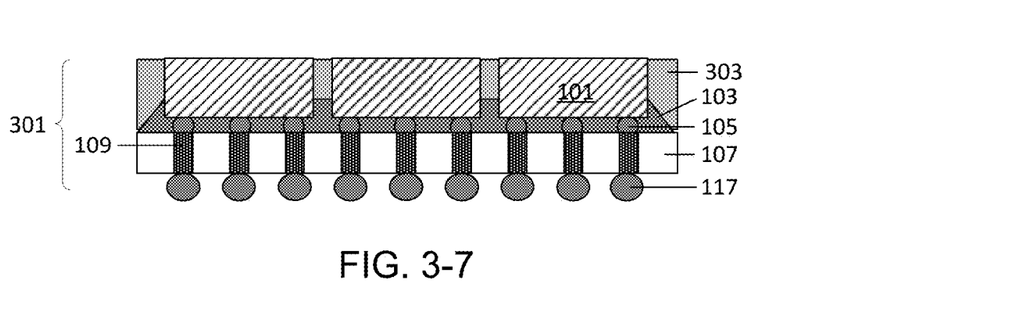

After the subsequent stacked silicon device formation steps have been performed and the carrier wafer 115 has been removed from the mold compound, the thin layer of mold compound 303 covering the top surfaces of the dies 101 is removed, as illustrated in FIG. 3-7.

In some cases, the thin layer of mold compound 303 on the top surfaces of the dies 101 may be removed using a grinding process that may involve using a coarse grinding or fine grinding technique. In other cases, the thin layer of mold compound 303 on the top surfaces of the dies 101 may be removed using an etching process, such as a plasma etch or chemical etch. In other cases, the thin layer of mold compound 303 on the top surfaces of the dies 101 may be removed by performing laser ablation on the mold compound 303.

The thin layer of mold compound 303 covering the top surfaces of the dies 101 is removed to allow for subsequent operation of the stacked silicon device 301 to occur without problems. This is because leaving the thin layer of mold compound 303 on the top surface of the dies 101 may not provide for adequate heat dissipation during operation of the stacked silicon device 301, which may lead to undesirable behavior of the stacked silicon device 301. By removing the thin layer of mold compound 303 from the top surface of the dies 101, the dies 101 are better able to dissipate heat.

While FIGS. 3-1 to 3-7 illustrate some steps used in the formation of a stacked silicon device, one ordinarily skilled in the art will recognize that additional and/or alternative steps may also be used in forming a stacked silicon device. Such additional/alternative steps may also lead to charge exposure, however the thin layer of mold compound bound to the top surfaces of the dies will shield the dies from being exposed to those charges thereby preventing damage that may affect their performance.

In other cases, instead of attaching a plurality of dies 101 to the interposer 107, only one die may be attached to the interposer 107.

Figure 4:
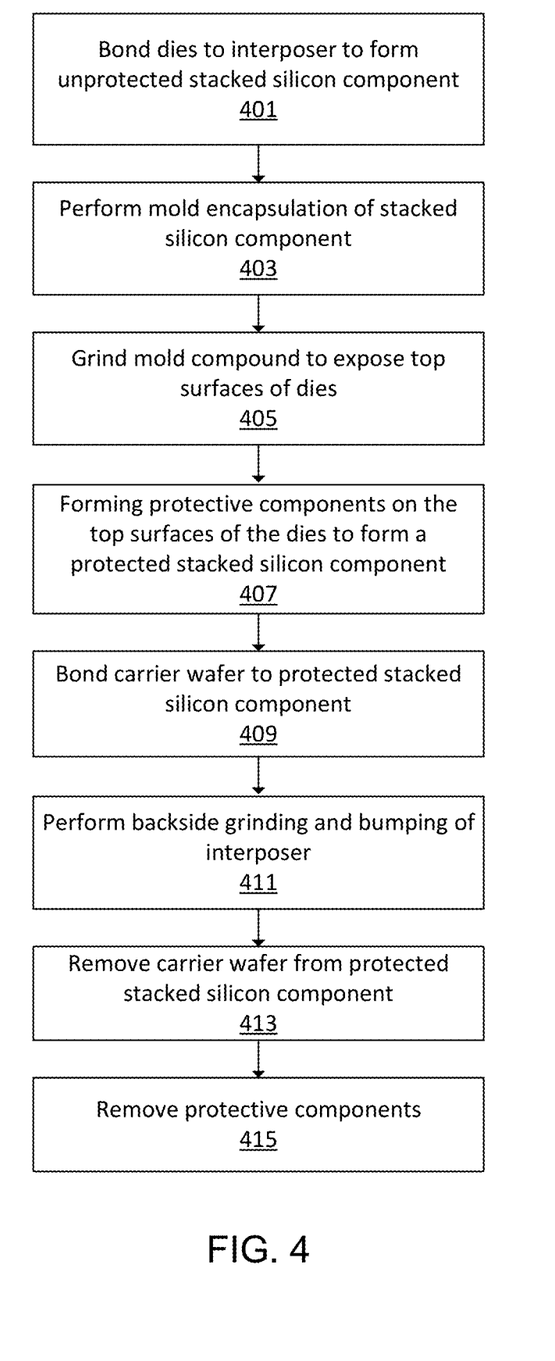
FIG. 4 is a flow diagram illustrating a method for providing charge protection to a plurality of dies during formation of a stacked silicon device.

FIG. 4 is a flow diagram illustrating another method for providing charge protection to a plurality of dies during formation of a stacked silicon device. The dies may be any types of semiconductor dies, such as FPGA dies, etc. Also, in other cases, instead of having multiple dies, there may be only one die. Also, the stacked silicon device may be a SSIT device in one example, but may also be any of other types of stacked silicon device in other examples.

Initially, dies are bonded to an interposer to form an unprotected stacked silicon component as shown at item 401. The term "unprotected stacked silicon component" will be used herein to refer to the structure resulting from bonding the dies to the interposer.

In some cases, the dies may be bonded to the interposer using solder bumps or microbumps. The solder bumps and microbumps may be composed of any electrically conductive material such as copper or nickel. It is the bottom surface of the dies that are bonded to the interposer via the microbumps.

The act of bonding the dies to the interposer may also include an underfill process to deposit underfill material between the dies and the interposer to provide for greater mechanical stability.

After the dies have been bonded to the interposer to form the unprotected stacked silicon component, mold encapsulation of the unprotected stacked silicon component is performed as shown at item 403. Mold encapsulation of the unprotected stacked silicon component involves depositing a mold compound over the unprotected stacked silicon component, such that the mold compound covers the top surface of the dies. As mentioned above, the mold compound may be composed of silica-filled epoxy material and the mold compound may be formed using techniques such as compression molding or vacuum lamination molding.

The mold compound may be composed of a thermally conductive material, or alternatively may be composed of a non-thermally conductive material.

The mold compound is then grinded to expose the top surface of the dies as shown at item 405. Grinding of the mold compound may be accomplished using a coarse grinding or fine grinding technique.

Protective components may then be formed on the top surfaces of the dies to form a protected stacked silicon component as shown at item 407. The protective components are formed such that the top surfaces of the dies are covered and the dies are protected from exposure to charge. In some cases, a protective component may be formed on each of the plurality of dies. In other cases, a protective component may be selectively formed on one or more of the plurality of dies.

In some cases, the protective components may be a non-conductive film. The non-conductive film may be composed of an epoxy and filler composite and may be formed either directly or indirectly on the top surface of a die. The non-conductive film may be configured to have various thicknesses for protecting the die from exposure to charge. In some cases, a thinner non-conductive film is preferred.

In other cases, the protective components on the top surfaces of the dies may be a dielectric layer. The dielectric layer may be formed directly or indirectly on the top surface of a die. The dielectric layer may be composed of an inorganic silicon-nitride (SiN) film or an inorganic silicon dioxide ($SiO_2$) film and may be deposited on the top surface of the die using a chemical vapor deposition (CVD) technique. Alternatively, the dielectric layer may be composed of an organic polyimide film that may be deposited on the top surface of the die using a spin-coat process. The dielectric layer may be configured to have various thicknesses for protecting the die from exposure to charge. In some cases, a thinner dielectric layer may be preferred. In some cases, the protective components may also be formed on a back of a wafer carrying the dies by spin coating an electrically non-conductive material before or after the bumping step and before the dicing process.

The protective components remain on the top surfaces of the dies during all of the subsequent stacked silicon device formation steps, and protect the dies from charge exposure during subsequent device formation steps. In order to allow for subsequent operation of the stacked silicon device to occur without problems, the protective components are later removed after subsequent stacked silicon device formation steps, which will be described in greater detail below.

During the performance of the grinding and polishing aspects of mold encapsulation, the unprotected stacked silicon component may be exposed to charge that may accumulate and later discharge into the dies. However, by shielding the top surfaces of the dies by the protective components, the dies are protected from any potential damage that may be caused by exposure to such charge.

A carrier wafer may then be bonded to the protected stacked silicon component as shown at item 409. The carrier wafer may be bonded to the protected stacked silicon component such that the carrier wafer is situated on top of the protective components. The carrier wafer is used to handle the protected stacked silicon component during subsequent process steps. The carrier wafer may be implemented as a glass wafer or a silicon wafer and techniques for bonding the carrier wafer to the protective components may involve thermal bonding using a thermally cured material which may be subsequently removed.

The carrier wafer may be utilized to handle the protected stacked silicon component during a backside grinding step and bumping step as shown at item 411. The backside grinding step involves grinding the backside of the interposer such that the TSVs may be exposed at the backside of the interposer. A bumping step is then performed to form C4 bumps on the backside of the interposer. The C4 bumps allow for communication between the dies and any external component (e.g., printed circuit board, package substrate) connected to the C4 bumps.

Once the backside grinding and bumping steps are completed, the carrier wafer is removed from the protected stacked silicon component as shown at item 413. Various processes may be utilized to remove the carrier wafer. One example process for removing the carrier wafer involves irradiating the carrier wafer with UV radiation to release the carrier wafer from the protected stacked silicon component. During the removal process, and any subsequent cleaning processes, the protected stacked silicon component may again be exposed to charge.

However, because the top surfaces of the dies are shielded by the protective components, the dies are protected from any potential damage that may be caused by exposure to such charge.

Thus, by forming protective components on top surfaces of dies, those dies may be shielded from charge exposure that may be associated with mold grinding/polishing and subsequent stacked silicon device formation steps.

After the subsequent stacked silicon device formation steps have been performed and the carrier wafer has been removed from the protected stacked silicon component, the protective components are removed as shown at item 415.

In some cases, the protective components on the top surfaces of the dies may be removed using an etching process, such as a plasma etch or chemical etch. In other cases, the protective components on the top surfaces of the dies may be removed by performing laser ablation on the protective components.

The protective components are removed to allow for subsequent operation of the stacked silicon device to occur without problems. This is because leaving the protective components on the top surface of the dies may not provide for adequate heat dissipation during operation of the stacked silicon device, which may lead to undesirable behavior of the stacked silicon device. By removing the protective components from the top surface of the dies, the dies are better able to dissipate heat.

Although the method has been described with reference to protecting multiple dies, in other cases, there may be only one die in the stacked silicon device.

FIGS. 5-1 to 5-8 are cross-sectional schematic diagrams illustrating a method for providing charge protection to a plurality of dies during formation of a stacked silicon device. The method may be the method described with reference to FIG. 4. In some cases, the stacked silicon device may be a SSIT device. In other cases, the stacked silicon device may be other types of stacked silicon device.

Figure 51:
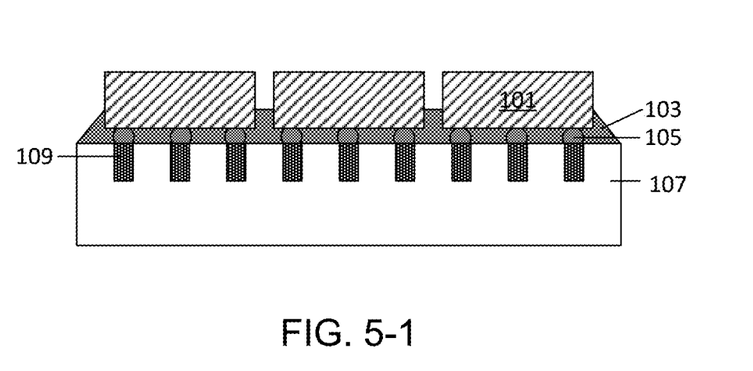

Initially, a plurality of dies 101 are bonded to an interposer 107 as illustrated in FIG. 5-1. The dies 101 are bonded to the interposer 107 to form an unprotected stacked silicon component. The term unprotected stacked silicon component is used herein to refer to the structure resulting from bonding the dies 101 to the interposer 107, where the dies 101 are not charge protected prior to being bonded to the interposer 107. The dies 101 may be bonded to the interposer 107 using solder bumps 105, that may also be referred to herein as microbumps. The microbumps 105 may be composed of various electrically conductive materials such as copper or nickel. An underfill process may also be performed to deposit underfill material 103 between the dies 101 and the interposer 107. This provides for greater mechanical stability between the dies 101 and the interposer 107.

The interposer 107 may include through-silicon-vias (TSVs) 109 to allow for the dies 101 to communicate between each other as well as to allow for the dies 101 to communicate with components external to the dies 101, such as a printed circuit board or other package substrate. When the plurality of dies 101 are initially bonded to the interposer 107, the interposer may be configured such that the TSVs 109 are only exposed at the surface adjacent to the dies 101. The TSVs 109 may be exposed at the opposite surface during subsequent processing steps, which will be described in greater detail below.

When the dies 101 are bonded to the interposer 107, a top surface of the dies 101 are exposed as illustrated in FIG. 5-1. The bottom surface of the dies 101 may be shielded by the underfill material 103, microbumps 105 and the dies 101 themselves.

Figure 52:
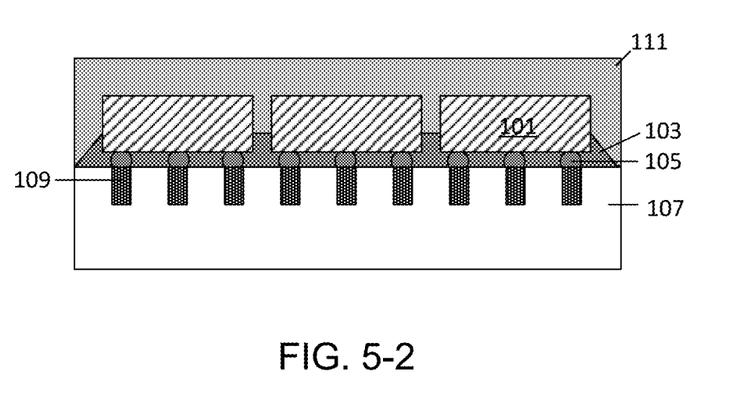

The unprotected stacked silicon component may then be encapsulated with a mold compound. This is illustrated in FIG. 5-2, where a mold compound 111 is formed over the unprotected stacked silicon component such that the mold compound 111 covers the top surface of the dies 101. The mold compound 111 may be composed of thermally conductive filler material such as aluminum oxide ($Al_2O_3$) or carbon nano-tubes and may be formed over the unprotected stacked silicon component using techniques such as compression molding or vacuum lamination molding.

Figure 53:
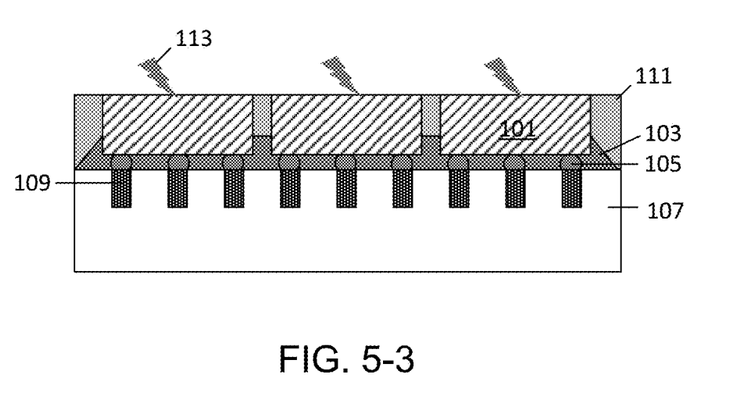

The mold compound 111 is then grinded to expose the top surfaces of the dies 101 as shown in FIG. 5-3. Grinding of the mold compound may be accomplished using a coarse grinding or fine grinding technique.

Figure 54:
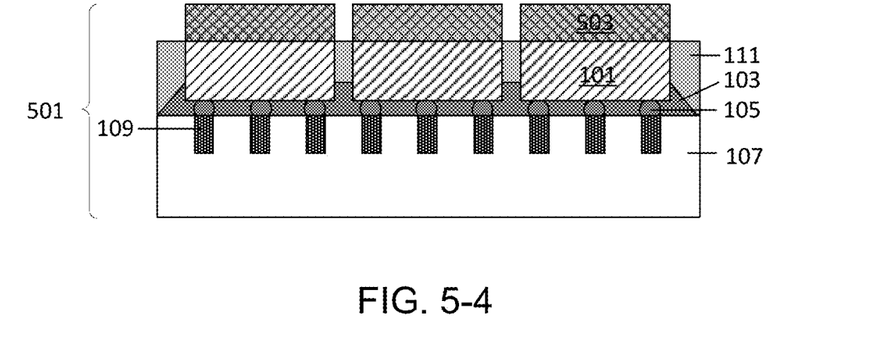

Protective components 503 may then be formed on the top surfaces of the dies 101 to form a protected stacked silicon component 501 as shown in FIG. 5-4. The protective components 503 are formed such that the top surfaces of the dies 101 are covered and the dies 101 are protected from exposure to charge.

In some cases, the protective components 503 may be a non-conductive film. The non-conductive film may be composed of an epoxy and filler composite and may be formed either directly or indirectly on the top surface of a die 101. The non-conductive film may be configured to have various thicknesses for protecting the die 101 from exposure to charge. In some cases, a thinner non-conductive film is preferred.

In other cases, the protective components 503 on the top surfaces of the dies 101 may be a dielectric layer. The dielectric layer may be formed directly or indirectly on the top surface of a die 101. The dielectric layer may be composed of an inorganic silicon-nitride (SiN) film or an inorganic silicon dioxide ($SiO_2$) film and may be deposited on the top surface of the die 101 using a chemical vapor deposition (CVD) technique. Alternatively, the dielectric layer may be composed of an organic polyimide film that may be deposited on the top surface of the die 101 using a spin-coat process. The dielectric layer may be configured to have various thicknesses for protecting the die 101 from exposure to charge. In some cases, a thinner dielectric layer is preferred.

The protective components 503 remain on the top surface of a die 101 during all of the subsequent stacked silicon device formation steps. In order to allow for subsequent operation of the stacked silicon device to occur without problems, the protective components 503 are later removed after subsequent stacked silicon device formation steps, which will be described in greater detail below.

During the performance of the grinding, the unprotected stacked silicon component may be exposed to charge 113 that may accumulate and later discharge into the dies 101. However, by shielding the top surfaces of the dies 101 by the protective components 503, the dies 101 are protected from any potential damage that may be caused by exposure to such charge.

Figure 55:
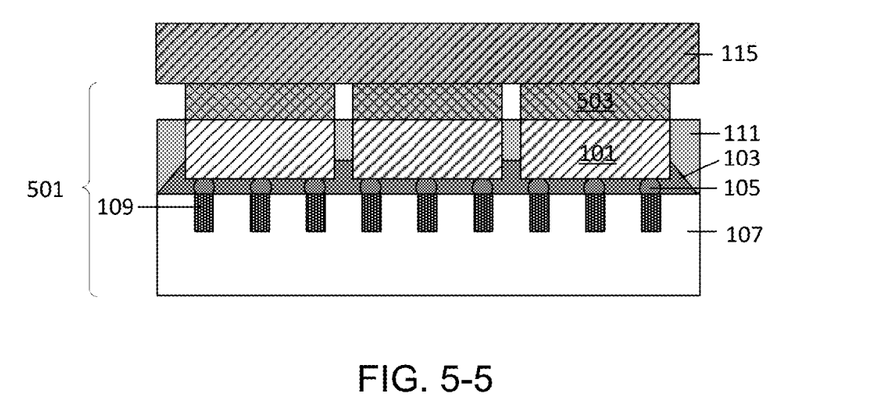

A carrier wafer 115 may then be bonded to the protected stacked silicon component 501 as illustrated in FIG. 5-5. The carrier wafer 115 may be bonded to the protected stacked silicon component 501 such that the carrier wafer 115 is situated on top of the protective components 503. The carrier wafer 115 is used to handle the protected stacked silicon component 501 during subsequent process steps. The carrier wafer 115 may be implemented as a glass wafer or a silicon wafer and techniques for bonding the carrier wafer 115 to the protective components 503 may involve thermal bonding using a thermally cured material which may be subsequently removed.

Figure 56:
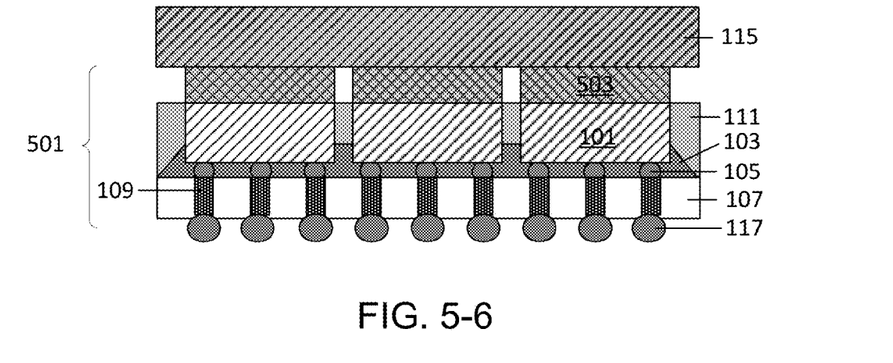

The carrier wafer 115 may be utilized to handle the protective components 503, dies 101, and interposer 107 during a backside grinding step and bumping step. The resulting structure is illustrated in FIG. 5-6. The backside grinding step involves grinding the backside of the interposer 107 such that the TSVs 109 may be exposed at the backside of the interposer 107. A bumping step is then performed to form C4 bumps 117 on the backside of the interposer 107. The C4 bumps 117 allow for communication between the dies 101 and any external component (e.g., printed circuit board, package substrate) connected to the C4 bumps 117.

Figure 57:
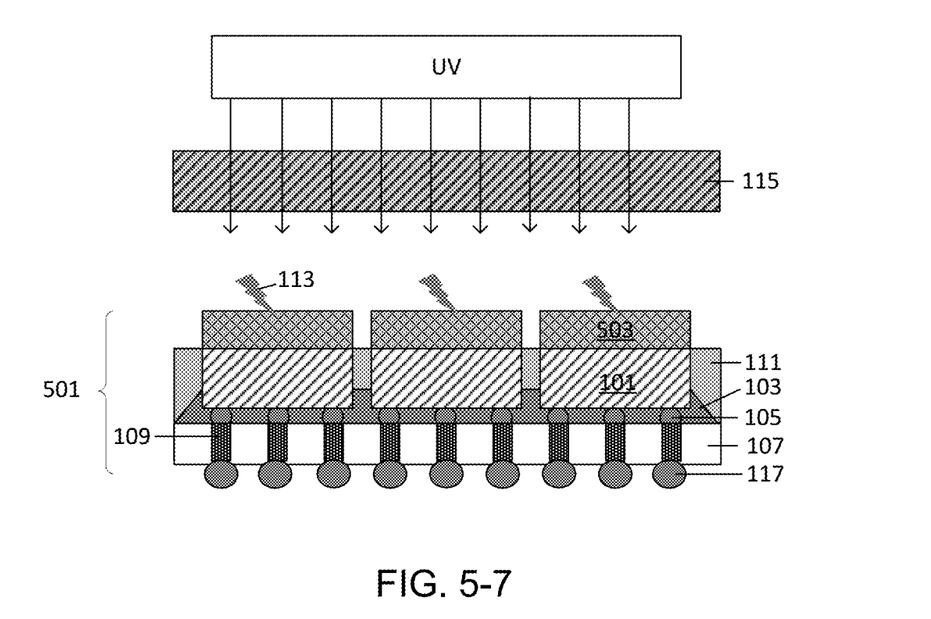

Once the backside grinding and bumping steps are completed, the carrier wafer 115 is removed from the protected stacked silicon component 501 as illustrated in FIG. 5-7. Various processes may be utilized to remove the carrier wafer 115. One example process for removing the carrier wafer 115 involves irradiating the carrier wafer 115 with UV radiation to release the carrier wafer 115 from the protected stacked silicon component 501. During the removal process, and any subsequent cleaning processes, the structure formed by the protective components 503, dies 101, and interposer 107 may again be exposed to charge 113.

However, because the top surfaces of the dies 101 are shielded from charge exposure by the protective components 503, the dies 101 are protected from any potential damage that may be caused by exposure to such charge 113.

Thus, by forming protective components 503 on top surfaces of dies 101, those dies 101 may be shielded from charge exposure that may associated with subsequent stacked silicon device formation steps.

Figure 58:
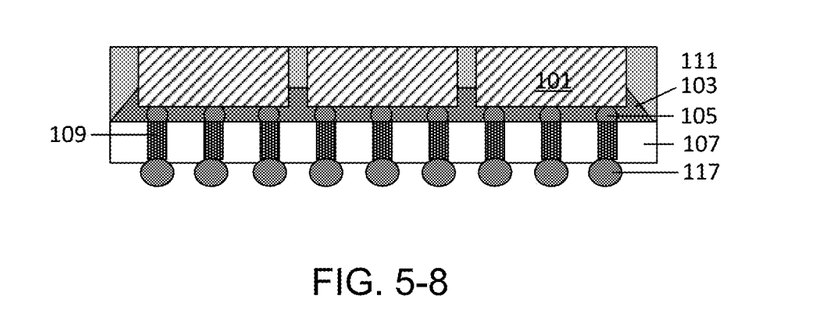

After the subsequent stacked silicon device formation steps have been performed and the carrier wafer 115 has been removed from the protected stacked silicon component, the protective components 503 covering the top surfaces of the dies 101 are removed, as illustrated in FIG. 5-8.

In some cases, the protective components 503 covering the top surfaces of the dies 101 may be removed using an etching process, such as a plasma etch or chemical etch. In other cases, the protective components 503 covering the top surfaces of the dies 101 may be removed by performing laser ablation on the protective components 503.

The protective components 503 covering the top surfaces of the dies 101 are removed to allow for subsequent operation of the stacked silicon device to occur without problems. This is because leaving the protective components 503 on the top surface of the dies 101 may not provide for adequate heat dissipation during operation of the stacked silicon device, which may lead to undesirable behavior of the stacked silicon device. By removing the protective components 503 from the top surface of the dies 101, the dies 101 are better able to dissipate heat.

While FIGS. 5-1 to 5-8 illustrate some steps used in the formation of a stacked silicon device, one ordinarily skilled in the art will recognize that additional and/or alternative steps may also be used in forming a stacked silicon device. Such additional/alternative steps may also lead to charge exposure, however the thin layer of mold compound bound to the top surfaces of the dies will shield the dies from being exposed to those charges thereby preventing damage that may affect their performance.

In other cases, instead of attaching a plurality of dies 101 to the interposer 107, only one die may be attached to the interposer 107.

Although particular features have been shown and described, it will be understood that they are not intended to limit the claimed invention, and it will be made obvious to those skilled in the art that various changes and modifications may be made without departing from the spirit and scope of the claimed invention. The specification and drawing are, accordingly, to be regarded in an illustrative rather than restrictive sense. The claimed invention is intended to cover all alternatives, modifications and equivalents.

What is claimed is:

1. A method for providing charge protection to a die during formation of an integrated circuit, comprising:
   bonding the die to an interposer to form an unprotected stacked silicon component;
   encapsulating the unprotected stacked silicon component with a mold compound to cover at least a top surface of the die;
   forming a protective component over the top surface of the die to form a protected stacked silicon component;
   bonding a carrier wafer to the protected stacked silicon component;
   removing the carrier wafer from the protected stacked silicon component; and
   removing the protective component from the top surface of the die after bumps are formed on the backside of the interposer and after the carrier wafer is removed from the protected stacked silicon component, to expose the top surface of the die.

2. The method of claim 1, wherein the protective component is formed by grinding the mold compound to reduce a thickness of the mold compound, and a remaining portion of the mold compound after the grinding becomes the protective component.

3. The method of claim 2, wherein:
   the act of grinding the mold compound leads to charge exposure; and
   the die is protected by the mold compound from the charge exposure caused by the grinding of the mold compound.

4. The method of claim 2, wherein:
   the act of removing the carrier wafer leads to charge exposure; and
   the die is protected by the mold compound from the charge exposure caused by removing the carrier wafer.

5. The method of claim 2, further comprising grinding the backside of the interposer to expose through-silicon-vias (TSVs) in the interposer, while the carrier wafer is bonded to the protected stacked silicon component.

6. The method of claim 5, further comprising forming the bumps on the backside of the interposer, while the carrier wafer is bonded to the protected stacked silicon component.

7. The method of claim 1, wherein the act of removing the protective component from the top surface of the die comprises grinding the mold compound.

8. The method of claim 1, wherein the act of removing the protective component from the top surface of the die comprises etching the mold compound.

9. The method of claim 8, wherein the act of etching the mold compound is performed using a plasma etch.

10. The method of claim 8, wherein the act of etching the mold compound is performed using a chemical etch.

11. The method of claim 1, wherein the act of removing the protective component from the top surface of the die comprises performing laser ablation on the mold compound.

12. The method of claim 1, further comprising grinding the mold compound to expose the top surface of the die.

13. The method of claim 12, wherein the act of forming the protective component over the top surface of the die comprises attaching a non-conductive film on the top surface of the die.

14. The method of claim 12, wherein the act of forming the protective component over the top surface of the die comprises depositing a dielectric layer on the top surface of the die.

15. The method of claim 12, wherein:
   the act of grinding the mold compound leads to charge exposure; and
   the die is protected by the protective component from the charge exposure caused by the grinding of the mold compound.

16. The method of claim 12, wherein:
   the act of removing the carrier wafer from the stacked silicon component leads to charge exposure; and
   the die is protected by the protective component from the charge exposure caused by removing the carrier wafer from mold compound.

17. The method of claim 12, further comprising grinding a backside of the interposer to expose through-silicon-vias (TSVs) in the interposer, while the carrier wafer is bonded to the protected stacked silicon component.

18. The method of claim 17, further comprising forming bumps on the backside of the interposer, while the carrier wafer is bonded to the protected stacked silicon component.

19. The method of claim 12, wherein the act of removing the protective component from the top surface of the die comprises etching the protective component.

20. The method of claim 19, wherein the act of etching the protective components is performed using a plasma etch or a chemical etch.

21. The method of claim 12, wherein the act of removing the protective component from the top surface of the die comprises performing laser ablation on the protective component.

* * * * *